(12) United States Patent  
Brittain et al.

(10) Patent No.: US 7,516,264 B2  
(45) Date of Patent: Apr. 7, 2009

(54) PROGRAMMABLE BANK/TIMER ADDRESS FOLDING IN MEMORY DEVICES

(75) Inventors: Mark Andrew Brittain, Pflugerville, TX (US); Warren Edward Maule, Cedar Park, TX (US); Gary Alan Morrison, Austin, TX (US); Jeffrey Adam Stuecheli, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 254 days.

(21) Appl. No.: 11/054,066

(22) Filed: Feb. 9, 2005

(65) Prior Publication Data

US 2006/0179206 A1    Aug. 10, 2006

(51) Int. Cl.  
*G06F 12/06* (2006.01)
(52) U.S. Cl. .......................................... 711/5; 711/105
(58) Field of Classification Search ................... 711/5, 711/104, 105, 173, 202, 203, 209; 257/907; 365/230.03  
See application file for complete search history.

(56) References Cited

U.S. PATENT DOCUMENTS

| | | | | |
|---|---|---|---|---|
| 4,473,877 A | * | 9/1984 | Tulk ............................... | 711/2 |
| 5,307,320 A | * | 4/1994 | Farrer et al. ............ | 365/230.01 |
| 5,452,257 A | * | 9/1995 | Han ....................... | 365/230.03 |
| 5,706,407 A | * | 1/1998 | Nakamura et al. ........... | 700/251 |
| 5,923,605 A | * | 7/1999 | Mueller et al. ......... | 365/230.03 |
| 6,430,648 B1 | * | 8/2002 | Carnevale ...................... | 711/5 |
| 6,560,686 B1 | * | 5/2003 | Nishida ....................... | 711/173 |
| 2003/0151968 A1 | * | 8/2003 | Johnson ................. | 365/230.03 |
| 2003/0182491 A1 | * | 9/2003 | Chudnovsky .................. | 711/5 |
| 2005/0117429 A1 | * | 6/2005 | Lin ............................. | 365/222 |

OTHER PUBLICATIONS

Tanenbaum, Andrew S., Structured Computer Organization, 1984, Prentice-Hall, Inc., pp. 10-12.*

* cited by examiner

*Primary Examiner*—Reginald G Bragdon  
*Assistant Examiner*—Kenneth M Lo  
(74) *Attorney, Agent, or Firm*—Diana R. Gerhardt; Dillon & Yudell LLP

(57) ABSTRACT

A set of N copies of bank control logic are provided for tracking the banks within the memory modules (DRAMS). When the total number of banks within the memory module (s) is greater than N, the addresses of particular banks are folded into a single grouping. The banks are represented by the N copies of the bank control logic even when the total number of banks is greater than N. Each bank within the group is tagged as being busy when any one of the banks in the group is the target of a memory access request. The algorithm folds the addresses of the banks in an order that substantially minimizes the likelihood that a bank that is in a busy or false busy state will be the target of another memory access request. Power and logic savings are recognized as only N copies of bank control logic have to be supported.

8 Claims, 3 Drawing Sheets

* INTERNAL RANKS THAT ARE FOLDED ON TOP OF OTHER RANKS

\* INTERNAL BANKS THAT ARE FOLDED ON TOP OF OTHER BANKS

* INTERNAL RANKS THAT ARE FOLDED ON TOP OF OTHER RANKS

PROGRAMMABLE BANK/TIMER ADDRESS FOLDING IN MEMORY DEVICES

BACKGROUND OF THE INVENTION

1. Technical Field

The present invention relates generally to computer memory devices and in particular to accessing computer memory devices. Still more particularly, the present invention relates to a method and system for efficiently tracking busy banks within computer memory devices.

2. Description of Related Art

Computer memory typically comprises one or more memory modules (e.g., dual inline memory modules (DIMMs) with one or more memory devices, such as synchronous dynamic random access memory (DRAM) or its static counterpart, SRAM. Standard DIMMs typically will contain 4 to 18 DRAMs and custom designs may contain as many as 72 or more DRAMs.

DRAMs on a DIMM are divided into independently addressable memory blocks, referred to as ranks. Depending on the type of DRAM and DIMM, each rank will span multiple DRAMs ranging from a few to 18 per rank. Typical industry standard DIMMs will contain one or two ranks, with custom DIMMs containing 4, 8, or more ranks. Within each rank on a DIMM there will be some number of independent internal banks of memory that can be accessed in an overlapped manner. The number of banks is DRAM technology dependent but generally the number is 4 or 8 banks.

As the desire for more memory capacity and bandwidth increases, custom DIMMs will be designed with multiple ranks of DRAMs that may have combined totals of 32, 64 or more banks of memory. Further, multiples of such DIMMs are often provided within a single memory system resulting in systems that may have very large numbers of independent banks of memory. For example, a 4 DIMM system with 8 ranks per DIMM and 8 internal banks per DRAM would have a total of 256 banks.

Supporting these large numbers of banks often requires a large amount of logic within the memory controller. Typically a memory controller will contain specific logic (Bank Control Logic—BCL) for each bank in the system to track information and status on the DRAMs within the bank. Included in this logic would be the address range for the memory, the state of the DRAMs (idle, active, etc.), timers to track active states, logic to track open pages, etc. All this logic adds up to a significant amount of silicon area and power consumption in the memory controller. In addition, the cone of logic gets deeper as banks are added and can eventually impact the frequency of operation of the logic or the number of latency cycles to propagate through the logic. For systems that only support small number of banks of memory, this is generally not an issue, but if the system needs to support large number of banks (e.g., greater than 32 banks), then the increased amount of logic to support these banks becomes a significant design challenge.

As is shown in the art, when a bank of the DRAM is accessed, the bank goes into a busy state for a predetermined amount of time before the bank may be accessed again. This predetermined amount of time that the bank will be busy varies based on the DRAM installed and the frequency of operation, but may easily be 16 or more times the length of a data transfer from a bank of memory. With this large busy time, a memory system needs to have multiple banks of memory that can be accessed in an overlapped manner to utilize the available bandwidth on the system data bus. Therefore, adding additional banks of memory and the associated Bank Control Logic to support these additional banks may significantly increase the system memory performance. With each bank added, the additional performance gain becomes less and less, as the system reaches a level where there are more banks of memory available than can be accessed at one time.

A conventional memory controller designed to support a system with a large number of banks of memory, such as 128 or 256 banks, would required adding significant silicon area to contain all the Bank Control Logic blocks needed for each of the supported banks in the memory system. This additional logic will add cost and complexity to the designs, even though the performance gain from adding additional banks past the 32 or 64 banks is not significant. Given that the performance gain for these additional banks of memory is not significant, a method is needed to add the banks of memory without significantly increasing the logic or cost of the memory controller.

SUMMARY OF THE INVENTION

Disclosed is a method and system for efficiently folding independent addressable memory banks into folded groups to reduce the amount of Bank Control Logic required for tracking large numbers of banks within a memory system. The memory controller will contain N individual copies of the Bank Control logic to track the independent memory banks within the memory system. An algorithm is provided within the memory controller logic or within the firmware of the system that monitors when the total number of banks within the memory system is greater than N, and responds to this condition by folding the addresses of particular banks together into groups to bring the number under the system limit of N independent banks. Each of the N copies of the Bank Control Logic will therefore be allocated to represent a grouping of banks, such that all banks may be represented by the N available copies of the logic even when the total number of banks is greater than N.

According to the method of the invention, all the independent banks within a group become semi-independent. When one of the banks within a group is being accessed by a memory operation then all the other banks within the group are unavailable for a memory operation since they share the same bank control logic. These are still physically independent of each other but they appear to take the state of the accessed bank even though they are actually idle. Banks that are not actually accessed are in a false busy state. The algorithm folds the addresses of the banks in an order that substantially minimizes the likelihood that a bank that is in a busy or false busy state will be the target of another memory access request before the entire group of banks returns from the busy state (i.e., the busy bank completes processing and recharging, etc. and goes to idle state).

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF ILLUSTRATIVE EMBODIMENTS

The present invention provides a method and system for efficiently folding independently addressable memory banks into folded groups to reduce the amount of bank control logic required for tracking the banks within a memory system. The memory controller will contain N individual copies of the Bank Control logic to track the independent memory banks within the memory. An algorithm is provided within the memory controller logic or within the firmware of the system that monitors when the total number of banks within the memory system is greater than N, and responds to this condition by folding the addresses of particular banks together into groups to bring the number under the system limit of N independent banks. Each of the N copies of the Bank Control Logic will therefore be allocated to represent a grouping of banks, such that all banks may be represented by the N available copies of the logic even when the total number of banks is greater than N.

According to the method of the invention, all the independent banks within a group now become semi-independent. When one of the banks within a group is being accessed by a memory operation then all the other banks within the group are unavailable for a memory operation since they share the same bank control logic. These are still physically independent of each other but they appear to take the state of the accessed bank even though they are actually idle. Banks that are not actually accessed are in a false busy state. The algorithm folds the addresses of the banks in an order that substantially minimizes the likelihood that a bank that is in a busy or false busy state will be the target of another memory access request before the entire group of banks returns from the busy state (i.e., the busy bank completes processing and recharging, etc. and goes to idle state).

Figure 1:
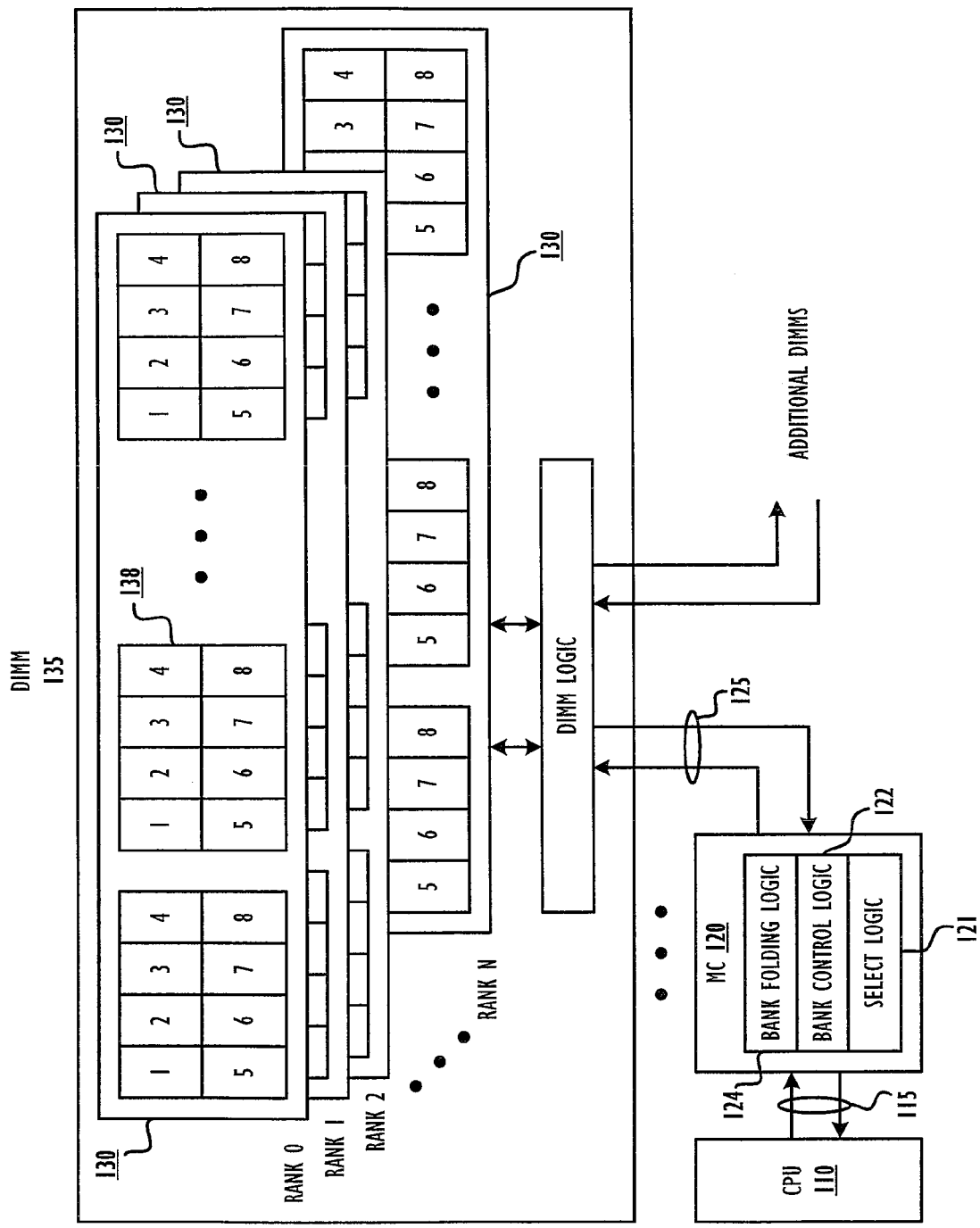
FIG. 1 depicts a memory system with DRAMs subdivided into banks and ranks and logic within the memory controller for programming bank control logic to support different numbers of banks in accordance with one embodiment of the invention.

With reference now to the figures, and in particular to FIG. 1, there is illustrated one exemplary memory system within which features of the present invention may advantageously be implemented. FIG. 1 illustrates central processing unit (CPU) 110, a memory controller 120 and a memory (DIMM) 135, interconnected via a series of address/control/data buses. System bus 115 provides a plurality of system data bus lines, system address bus lines, and system control lines that enable data and requests to be transferred between the CPU 110 and other system components connected to the system bus, including various components provided by memory controller 120. Memory bus 125 provides similar bus lines connecting memory controller 120 to memory (DIMM) 135 and eventually to the memory devices (DRAMs) 130. While memory controller 120 is shown separate from CPU 110, memory controller 120 may be combined with CPU 110 on a single chip.

As utilized herein, the terms memory and memory modules are synonymous with DIMMs and utilized interchangeably. Also, memory devices refer to DRAMs. However, the invention is applicable to other types of memory module and memory devices, that are similarly configured into ranks and banks as those memory components described herein.

As shown by FIG. 1, multiple memory devices 130 are provided on DIMM 135, and the configuration may be expanded to provide one or more DIMMs 135 each having a plurality of synchronous DRAMs 130. These DRAMs 130 are grouped together in sets to form ranks of memory (Rank 0 through Rank N). Each DRAM chip (130) comprises an array of cells logically partitioned into one or more banks, typically 4 or 8 per DRAM 130. While described as DRAMs in the illustrated embodiment, the memory devices may be any type of memory device that may be configured with ranks and banks (or their equivalent). Many such memory devices are commercially available. Memory module 135, in this embodiment, has memory devices 130 that are collectively grouped and partitioned into 64 banks 138 (or 8 ranks each having 8 banks).

Within memory controller 120 is select logic 121 for selecting a next request to send to memory devices 130 and bank control logic (components/devices) 122 which includes a number of timers and address mapping logic components/devices utilized to track individual banks (when there are less than N banks in memory system) and folded groupings of banks (when there are more than N banks in memory system). As explained in greater details below, N is an integer number of copies of the bank control logic (component/device) that is implemented in the memory controller that limits the number of independent memory banks that can be tracked in the system. In the illustrative embodiments, N is assumed to be 64 and thus the bank control logic (components/devices) account for 64 individual banks or up to 64 groupings of banks.

In addition to (or associated with) the bank control logic, the memory controller 120 also includes folding logic 124. Folding logic 124 provides an algorithm that determines/detects when more than N banks are present in memory system, and folding logic 124 defines the correct folding/groupings of banks to enable the N copies of the bank control logic to address the groupings of banks, and thus any one of the individual banks within the groupings. The algorithm thus assigns each of the individual N copies of the bank control logic 122 to one of the groupings of banks.

The bank control logic 122 operates according to conventional processes when there are less than N banks. When there are more than N banks, however, folding logic 124 programs/adjusts the bank control logic 122 to enable banks to be addressed in groups. In this latter embodiment, when a memory access request is received at memory controller, the memory access proceeds as usual, and the bank control logic 122 tracks the targeted bank by busying the entire grouping within which the addressed bank is folded. That is, when a memory access request targets one bank within a grouping of banks (with addresses folded together), all banks within the grouping are busied and future accesses to the grouping (even the banks that are false busy) are delayed until the targeted bank returns to a non-busy/idle state.

Assignment of Groupings

As the number of banks continues to increase, banks are folded according to an algorithm for the particular memory configuration. The invention avoids any negative performance impact on accessing extended memory of more than 64 banks by allowing the bank control logic to be programmably associated with banks or groupings of banks based on each system configuration. The programmability of the logic allows assignment of full coverage (one bank for each copy of the control logic) for systems with fewer banks where throughput may be bank-constrained. However, in memory systems where there are enough banks to not limit performance, the programmability feature of the bank folding logic saves area and power by grouping banks together and sharing the N copies of the bank control logic among groupings of banks.

Typically, accesses to the memory banks are sequential in nature. Assigning banks to groupings thus involves grouping banks that are not normally accessed sequentially or in close proximity to each other. In this way, the likelihood of hitting another bank within a folded group of banks while one bank within the group is still busy is substantially reduced.

The banks are overlaid so that accesses generally do not hit "false busy" banks. The number and type of folds may be different based on the width of the DIMMs (i.e., number of banks within each row of the DIMM). However, according to the illustrative embodiment, the algorithm enables the use of the full set of bank control logic blocks when grouping banks by implementing the following conditions:

(1) banks that are folded are always on the same DIMM;
(2) sequentially addressed banks are not folded together; and
(3) the number of ranks that are folded is minimized.

The exemplary embodiment is described with 64 copies of the bank control logic to track 64 independent banks of memory. Accordingly, the bank selection logic will use 6 bits from the address field to assign address space to the individual 64 banks. Depending on the 6 bits selected, the sequential address space will either address into the banks or across the banks. The selection of the 6 bits is made at a system level to optimize utilization of as many of the 64 banks of memory as possible. The 6 bits will split the address space of the system into 64 blocks with each address block being assigned a copy of the bank control logic. When a memory access is mapped into one of the address blocks, the associated bank control logic will go into a busy state and future access to that one individual bank of memory will be blocked until the bank control logic goes back to an idle state.

For systems where more than 64 banks of memory are installed, additional address bit(s) will be used to split the address space into 128, 256 or more address blocks. The number of extra bits used depends on the total number of banks installed. For example if there are 65 to 128 banks installed in the system, then 7 address bits will be used to assign the system address space. When more then 6 address bits are used there will be more individually addressable address blocks (i.e., banks of memory) then there are copies of the bank control logic. For such cases, multiple address blocks (and their associated banks of memory) will be assigned to the same copy of the bank control logic.

When a memory access request hits one of the address blocks that is sharing a copy of the bank control logic with one or more other banks, the associated bank control logic will go into a busy state and all future accesses to that bank of memory will be blocked until the bank control logic returns to an idle state. In addition, all accesses to any other bank of memory that is sharing the same bank control logic will also be blocked until the bank control logic returns to the idle state. These secondary banks of memory are not actually busy, but to the selection logic in the memory controller they appear to be busy.

In a simplest implementation, when a bank is accessed, rather than tagging a single bank as busy, all banks with the group (e.g., 2 banks for 128 bank memory system and 4 banks for a 256 bank system) are busied simultaneously. No access to any one of these 2 or 4 banks is possible during the busy period although only one of the banks within the group is actually busy processing the access request.

The invention avoids the additional overhead of cost, power, and space cost required if 128 or 256 copies of the bank control logic were utilized to track the 128 and 256 banks independently (to provide one set of control logic per bank). Addition of more banks to the memory system is handled by the same 64 copies of the bank control logic and the tracking of busy/idle banks is thus completed with the same latency as if only 64 banks were present. Adding more copies of the bank control logic would add additional latency to the tracking process as an additional series of latches would be required for address comparisons, etc.

With conventional systems, the 64 copies of the bank control logic are individually identified and linked to a physical bank of memory by one of the 64 possible combinations of the 6 address bits selected to split the address space, 000000, 000001, 000010 . . . 111101, 111110, 111111. The bank control logic tracks which banks are currently busy, by assigning one or more of the first bits to identify the DIMM, two or more of the second set of bits to identify the rank and then two or more of the remaining bits to identify the bank. Table A below illustrates possible bit allocation depending on the configuration of the memory system.

TABLE A

| No. DIMMs | No. Ranks | No. Banks | Address Bits # Allocation |
| --- | --- | --- | --- |
| 1 | 8 | 8 | None, 012, 345 |
| 2 | 8 | 4 | 0, 123, 45 |
| 2 | 4 | 8 | 0, 12, 345 |
| 4 | 4 | 4 | 01, 23, 45 |

Thus, the 64 copies of the bank control logic are able to control a single DIMM with eight ranks and eight banks, two DIMMS with eight ranks and four banks, and four DIMMs with 4 ranks and 4 banks, etc.

Turning now to systems that have more than 64 banks of memory. An example of such a system would be a system with 4 DIMMs, each with 4 ranks containing DRAMs that have 8 internal banks. This 4-DIMM system contains 128 banks of memory and is thus no longer able to have each of the banks assigned its own individual bank control logic. Accordingly, the bank folding logic assigns groupings of two banks to the same copy of the bank control logic.

One method by which this assignment (or grouping) is completed is by combining the address space of the 4 ranks on the DIMM into two copies of the bank control logic. This combination would effectively make the DIMM appear to have only 2 ranks each. Another method for completing this assignment/grouping involves folding the upper 4 internal banks in the DRAMs with the lower 4 internal banks. In this latter method, the DRAMs would appear to have only 4 internal banks. Notably, with both of these implementations, the folding occurs within the DIMMs and not across the DIMMs. Also, in both cases, the folding results in an effective total of 64 banks in the memory subsystem.

Figure 2:
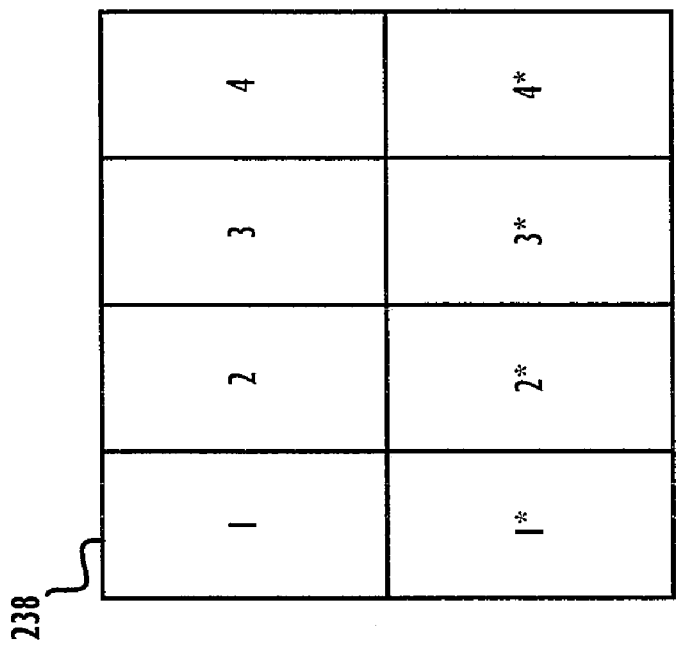
FIG. 2 illustrates an example of a DRAM folded on its internal banks according to one embodiment of the invention.
Figure 2:
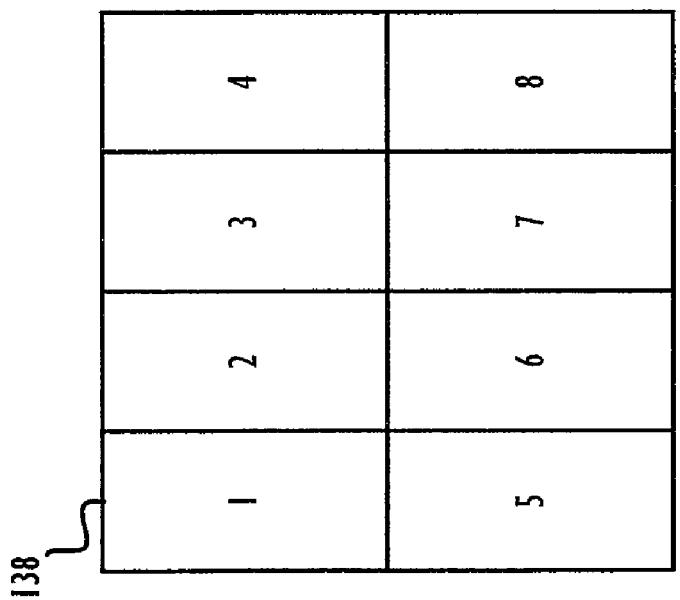
Figure 3:
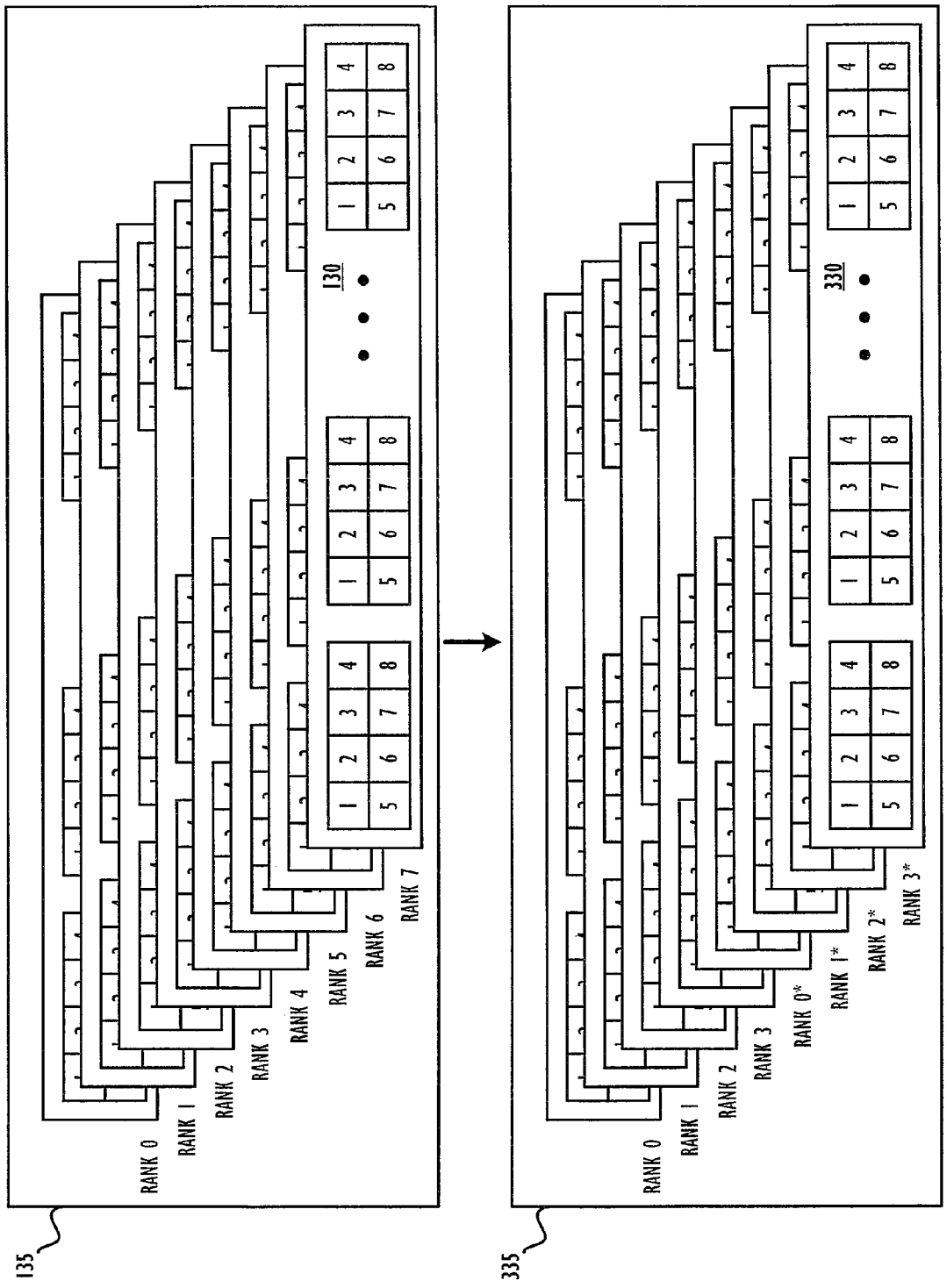
FIG. 3 illustrates an example of a DIMM folded on its internal ranks according to one embodiment of the invention.

FIGS. 2 and 3 respectively illustrate memory banks 238, where the internal banks 238 of a rank are folded, and DIMMs 335, where the banks are folded across the ranks 330 of the DIMM, according to the above two described implementations of the invention. Both figures illustrate a 128 bank implementation. However, the illustrative embodiment teaches how the folding logic could extend this method to a system with 256 banks, 4 DIMMs, 8 ranks, and 8 internal banks. With this particular memory configuration, a first embodiment folds both the number of ranks and the number of internal banks. Another alternative embodiment folds the 8 ranks down to 2 ranks, and a third alternative embodiment folds the 8 banks down to 2 banks. Selection of the specific embodiment to implement depends on how the address space is distributed among the DIMMs, and the folding logic is preprogrammed to provide the most efficient fold based on any one of the multiple possible configurations of memory.

With two or four similarly configured DIMMs in the memory system, the algorithm of the folding logic takes the total number of banks, completes the folding and stores the folded groupings within the memory controller. When additional DIMMs are plugged into the memory system, the DIMMS register themselves with the memory controller, which assigns the address space across the number of available DIMMs and divides the number of DIMMs into the individually addressable banks. The allocation of the addresses to specific DIMMs, DRAMs, ranks and banks is stored within the memory controller to enable efficient routing of access requests throughout the memory system.

According to the invention, the folding logic monitors for addition to the memory subsystem of more than 64 banks and responds by grouping banks so that the bank control logic provided for tracking 64 banks may be utilized with little enhancement to track the additional banks. In one embodiment, the folding logic generates an allocation table, with similar groupings as those illustrated by FIGS. 2 and 3 for 128 banks and 256 banks, respectively. As shown by these figures, each value is allocated to multiple banks that are within a folded grouping.

The number of banks folded into each group depends on the total number of banks within the system. For example, with a memory system having 2 DIMMs with 8 ranks and 8 banks, the grouping of banks would be similar to that indicated by FIG. 2 or 3. As shown, internal banks 4-7 would be folded into internal banks 0-3 or alternatively ranks 4-7 would be folded into ranks 0-3. Further, when a request is received that targets any bank within a folded set, all the banks in that set are then considered active and any new request that targets a bank within the same folded set of banks will be held within the memory controller queues until the particular folded set is no longer busy.

Notably, the address of the request may target a bank that is a false busy bank rather than a bank that is actually busy. However, the invention avoids the potential problems of tracking additional busy periods within a single grouping by treating a false busy as an actual busy and withholding issuing the new access requests to the memory system.

One way of handling the grouping of banks is by treating the additional address bits required for tracking each bank individually as "don't cares." Table B below illustrates how use of the don't care bits enables the folding of banks when 128 banks and 256 banks are provided by the memory system. Don't cares are indicated with a strike-through on the "don't care" bit.

TABLE B

| No. DIMMs | No. Ranks | No. Banks | Timer Bits # Allocation |
|---|---|---|---|
| 2 | 8 | 8 | 0, 123, 456 |
| 4 | 4 | 8 | 01, 23, ~~4~~56 |
| 4 | 8 | 4 | 01, ~~2~~34, 56 |
| 4 | 8 | 8 | 01, 234, 567 |
| 8 | 4 | 8 | 012, 34, 567 |
| 8 | 8 | 4 | 012, 345, 67 |

To utilize 100% of bandwidth, a preset number of ranks is required. However, above this number, the performance benefit that is gained by adding more ranks reduces with each bank added to the system. The present invention thus keeps track of enough ranks to get to the maximum performance out of the system without requiring all the additional logic needed to mannage the extra banks of memory.

However, the banks must be folded the right way to not reduce overall performance. Folding of the addresses effectively makes DRAMs internal banks appear physically larger in size from the perspective of the memory controller. For example a 1 GBit DRAM with 8×128 MBit internal banks will appear as a 1 GBit DRAM with 4×256 MBit internal banks.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention.

The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. In a memory subsystem having a memory controller connected to memory devices divided internally into ranks and banks for addressing data in blocks, a method comprising:

determining when the number of banks within the memory subsystem is larger than N, where N represents a total number of available bank control logic components within the memory controller;

when the number of banks within the memory subsystem is not larger than N, allocating an individual one of the available bank control logic components to each of the banks within the memory subsystem;

when the number of banks is larger than N, folding multiple ones of the banks within a memory device into a set to be addressed by a single one of the available bank control logic components, wherein said folding includes virtually combining the multiple banks into the set such that access to each of the multiple banks of the set are controlled by a same bank control logic component; and when a memory access operation is received addressed to a first bank:

identifying which set from among a plurality of sets of banks that the first bank is folded into; and controlling access to the first bank and all banks within the identified set using the single bank control logic component allocated to the identified set, wherein the plurality of sets each have multiple banks folded therein and a separate bank control logic component allocated thereto, and wherein the identified set is treated as being a single bank for purposes of controlling memory access operations targeting any one of the banks within the identified set; and wherein said folding multiple ones of the banks comprises:
folding banks within Dual Inline Memory Modules (DIMMs) in a predetermined configuration that minimizes subsequent accesses hitting "false busy" banks;
folding only banks that are not sequentially addressed;
folding across banks prior to folding across ranks to minimize the number of ranks that are folded;
when rank-level folding is required, combining an address space of Y ranks on the DIMMs into Y copies of the same bank control logic component;
when only bank-level folding is required:
folding a first X internal banks in Dynamic Access Memories (DRAMs) with a second X internal banks of the DRAMs to create a set;
wherein said folding is carried out within individual DIMMs and not across the DIMMs; and
wherein said folding produces an effective total of N sets of banks in the memory subsystem.

2. The method of claim 1, further comprising:
allocating the particular one of the bank control logic component to the set of banks; and
wherein when said number of banks within the memory subsystem is not larger than N, allocating an individual one of the bank control logic component to each of the banks within the memory subsystem.

3. The method of claim 1, wherein said folding comprises:
determining a distribution of available address space among memory modules; and
adjusting a folding algorithm to provide a most efficient folding pattern based on any of a particular distribution of said available address space and a configuration of the memory system.

4. The method of claim 1, wherein the controlling access to banks within the set comprises:
identifying when a memory access operation targets one of the banks within the set of banks;
performing the memory access operation on the particular one of the banks; and
indicating as busy all banks within the set of banks, wherein no access to any one of the banks within the set of banks is permitted while the particular one of the banks is in a busy state.

5. The method of claim 4, further comprising returning an identified operational state for each of said banks within the set of banks to idle when the particular one of the banks completes processing the memory access operation and returns to an idle state.

6. A computer system comprising:
a processor that generates memory access requests;
a memory subsystem coupled to the processor and which includes a memory controller that responds to said memory access requests by initiating operations within memory devices, said memory devices being internally configured with a plurality of ranks and banks;
a plurality of bank control logic components within the memory subsystem for controlling accesses to the individual banks within the memory devices;
logic for determining when the number of banks within a memory subsystem is larger than N, where N represents a total number of available bank control logic components within the memory controller;
when said number of banks within the memory subsystem is not larger than N, logic for allocating an individual one of the plurality of bank control logic components to each of the banks within the memory subsystem;
when the number of banks is larger than N:
logic for folding multiple ones of the banks into a set to be addressed by a single one of the bank control logic devices, wherein said folding includes virtually combining the multiple banks into the set such that access to each of the multiple banks of the set are controlled by a same bank control logic component, independent of access operations targeting other banks within other sets that have a separate bank control logic component allocated thereto;
logic for allocating the single one of the bank control logic devices to the set of banks; and
logic for enabling the single bank control logic device to subsequently treat an access to a bank within the set as being an access to all banks within the set for purposes of controlling memory access operations targeting any one of the banks within the set; and
wherein said logic for folding includes logic for implementing the following:
folding banks within Dual Inline Memory Modules (DIMMs) in a predetermined configuration that minimizes subsequent accesses hitting "false busy" banks;
folding only banks that are not sequentially addressed;
folding across banks prior to folding across ranks to minimize the number of ranks that are folded;
when rank-level folding is required, combining an address space of Y ranks on the DIMMs into Y copies of the same bank control logic component;
when only bank-level folding is required:
folding a first X internal banks in Dynamic Access Memories (DRAMs) with a second X internal banks of the DRAMs to create a set;
wherein said folding is carried out within individual DIMMs and not across the DIMMs; and
wherein said folding produces an effective total of N sets of banks in the memory subsystem.

7. The computer system of claim 6, wherein said logic for folding comprises logic for:
determining a distribution of available address space among the memory modules; and
adjusting a folding algorithm to provide a most efficient folding pattern based on any a particular distribution of said available address space and a configuration of the memory system.

8. The computer system of claim 6, wherein the logic for treating all banks within a set as a single bank comprises logic for:
identifying when a memory access operation targets one of the banks within the set of banks;
performing the memory access operation on the particular one of the banks;
indicating as busy all banks within the set of banks, wherein no access to any one of the banks within the set of banks is permitted while the particular one of the banks is in a busy state; and
returning an identified operational state for each of said banks within the set of banks to idle when the particular one of the banks completes processing the memory access operation and returns to an idle state.

* * * * *